United States Patent
Kamase

(10) Patent No.: US 6,191,638 B1
(45) Date of Patent: Feb. 20, 2001

(54) MIXER CIRCUIT INCLUDING SEPARATED LOCAL (LO) TERMINAL AND INTERMEDIATE FREQUENCY (IF) TERMINAL

(75) Inventor: Fumihiro Kamase, Tokyo (JP)

(73) Assignee: Nec Corporation, Tokyo (JP)

( * ) Notice: Under 35 U.S.C. 154(b), the term of this patent shall be extended for 0 days.

(21) Appl. No.: 09/066,845

(22) Filed: Apr. 28, 1998

(51) Int. Cl.[7] .................................................. G06G 17/016
(52) U.S. Cl. ............................................ 327/359; 327/356
(58) Field of Search ........................... 327/116, 119–122, 327/356, 357, 359

(56) References Cited

U.S. PATENT DOCUMENTS

| | | | |
|---|---|---|---|
| 3,683,165 | * 8/1972 | Grobert et al. | 708/7 |
| 5,337,005 | * 8/1994 | Fenk et al. | 327/113 |
| 5,584,069 | * 12/1996 | Sapotta et al. | 327/359 |

FOREIGN PATENT DOCUMENTS

| | | |
|---|---|---|
| 53-1413 | 1/1978 | (JP) . |
| 63-258107 | 10/1988 | (JP) . |
| 5-114823 | 7/1993 | (JP) . |

\* cited by examiner

*Primary Examiner*—Kenneth B. Wells
(74) *Attorney, Agent, or Firm*—McGinn & Gibb, PLLC

(57) ABSTRACT

A mixer circuit includes a first transistor and a second transistor of different conduction types which are connected and the emitter of the first transistor is connected to the collector of the second transistor, and the collector of the first transistor is connected to the emitter of the second transistor, a third transistor, whose collector is connected to the emitter of the first transistor, a power supply terminal connected to the collector of the first transistor, a radio frequency (RF) terminal connected to the collector of the first transistor, a local signal (LO) terminal connected to the base of the first transistor, an intermediate frequency (IF) terminal connected to the base of the second transistor, and a ground terminal connected to the emitter of the third transistor.

6 Claims, 7 Drawing Sheets

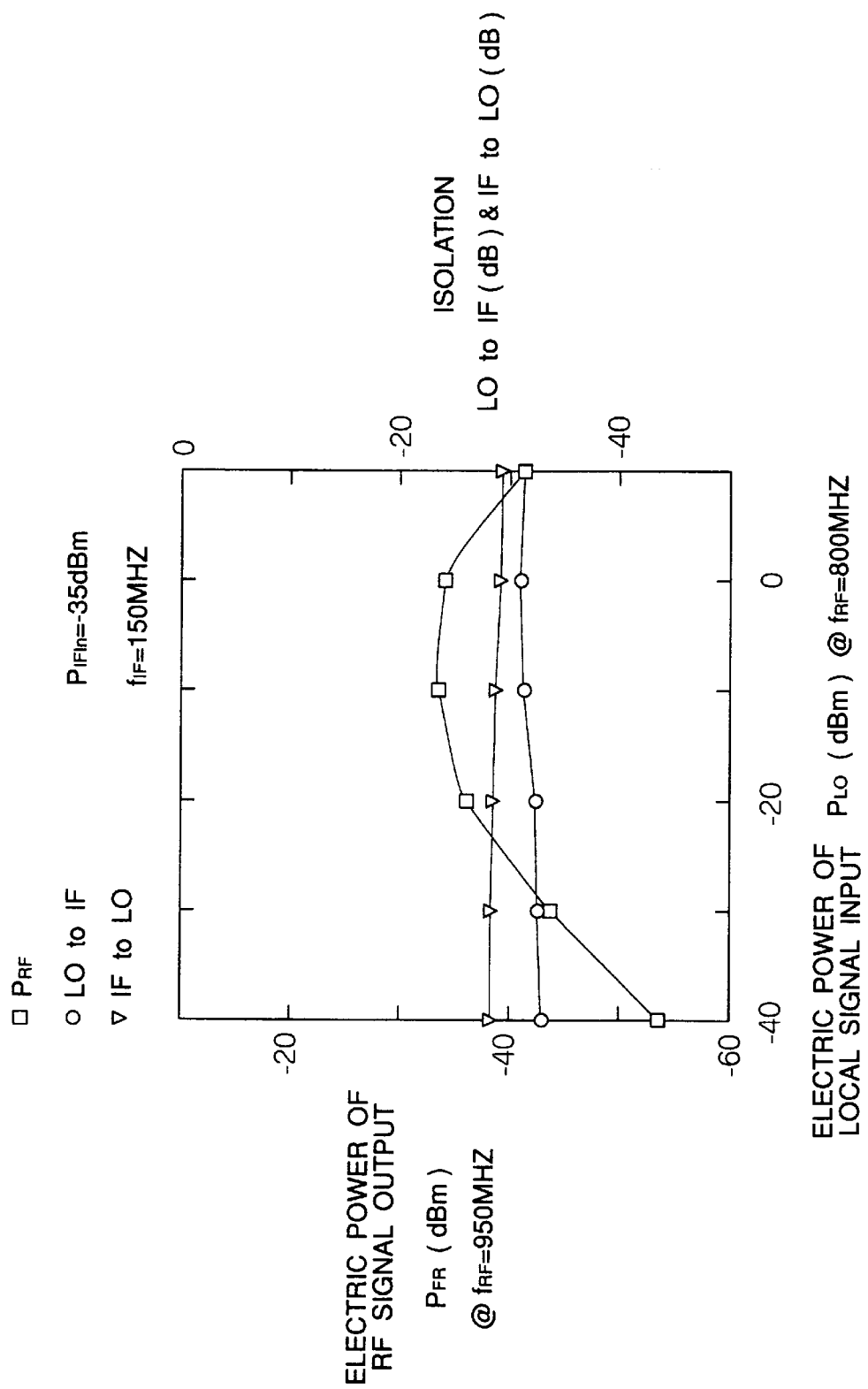

MIXER CIRCUIT INCLUDING SEPARATED LOCAL (LO) TERMINAL AND INTERMEDIATE FREQUENCY (IF) TERMINAL

BACKGROUND OF THE INVENTION

1. Field of the Invention

The present invention relates to a mixer circuit, and more particularly to an analogue mixer circuit which combines an intermediate frequency signal (hereinafter, called "IF signal") with a local signal (hereinafter, called "LO signal").

2. Description of the Related Art

FIG. 5 shows one example of the composition of a conventional mixer circuit 189. With reference to FIG. 5, the mixer IC (integrated circuit) 188 comprises one npn-type transistor 145. The collector of this transistor 145 is connected to an RE terminal 152, the base is connected to an input terminal 149, and the emitter is connected to a GND terminal 150. The base of the npn-type transistor 145 is connected to the junction point between a resistor 146 and a resistor 147. The other terminal of resistor 146 is connected to the collector of the npn-type transistor 145. The other terminal of resistor 147 is connected to the earth terminal (hereinafter, called "GND terminal") 150 of the mixer IC 188. The collector of the npn-type transistor 145 is connected to a power supply terminal 151 and furthermore, a resistor 148 is connected between the collector of the npn-type transistor 145 and the power supply terminal 151.

The power supply terminal 151 for supplying power to the mixer IC 188 is connected to a power supply 155, and the RF terminal 152 is connected via a capacitor 154 to an RF output terminal 164. Meanwhile, the input terminal 149 is connected via a capacitor 153 to the junction point between an inductor 157 and one terminal of a capacitor 160. The other terminal of the inductor 157 is connected to the junction point between an inductor 156 and one terminal of a capacitor 158. The other terminal of the inductor 156 is connected to an IF signal input terminal 162, and the other terminal of the capacitor 158 is earthed.

The other terminal of the capacitor 160 is connected to the junction point between the capacitor 159 and one terminal of the inductor 161, the other terminal of the capacitor 159 is connected to an LO signal input terminal 163, and the other terminal of the inductor 161 is earthed.

A first band-eliminating filter (BEF1) 186 is constituted by the capacitor 159, capacitor 160 and inductor 161, and a second band-eliminating filter (BEF2) 187 is constituted by the inductor 156, inductor 157 and capacitor 158.

A mixer circuit 189 is formed by the foregoing composition. In this mixer circuit 189, an IF signal is input from the IF signal input terminal 162 and it passes through the second band-eliminating filter 187. Furthermore, an LO signal is input from the LO signal input terminal 163, passes through the first band-eliminating filter 186 and is mixed with the IF signal as an input to the capacitor 153.

The first band-eliminating filter 186 and the second band-eliminating filter 187 are provided in order to isolate the IF signal and LO signal. Consequently, for the IF signal, the LO side appears to be in an open state due to the first band-eliminating filter 186, whilst for the LO signal, the IF side appears to be in an open state due to the second band-eliminating filter 187. By this means, the IF signal and LO signal are added together without one signal leaking in the circuitry of the other, and they pass through the capacitor 153 and are input to the input terminal 149 of the mixer IC 188.

The combined signal is amplified nonlinearly by the npn-type transistor 145 and it is then output from the RF terminal of the mixer IC 188, passed through the capacitor 154 and output from the RF output terminal 164.

Next, a further example of the related art is described with reference to FIG. 6. The composition of the mixer circuit 190 is disclosed in Japanese Unexamined Patent 63-258107. With reference to FIG. 6, in the mixer circuit 190, the collector of a transistor 165 is earthed via a capacitor 170. Therefore, this is similar to the high-frequency region being earthed. Furthermore, the npn-type transistor 165 operates nonlinearly, but the inductor 176 is connected via a capacitor 171 to the base of the npn-type transistor 165. The input terminal 180 of a local oscillator input from an external source is connected to the base of the npn-type transistor 165 via a wave filter circuit 177 and a capacitor 172. A capacitor 169 and a capacitor 173 are provided respectively between the base and emitter terminals, and between the emitter and GND terminals, of the npn-type transistor 165. The terminal 182 is a modulation signal input terminal. In addition, the emitter of the npn-type transistor 165 is connected to an output terminal 181 via a wave filter circuit 178.

By means of the foregoing composition, the emitter of the transistor 165 outputs a signal wherein a signal of frequency components input from the local oscillator and a signal of frequency components oscillating in the inductor 176 and capacitor 169, and capacitor 173, are combined with each other. Thereupon, the required signal only is extracted from a number of combined frequency component signals by means of the wave filter circuit (filter) 178.

FIG. 7 shows the results of a simulation of a conventional mixer circuit. In FIG. 7, the input frequency, $f_{IF}$, of the IF signal is set to a constant 150 (MHz) at IF signal input power of $P_{IFin}=-35$ (dBm). The output power $P_{RF}$, of the RF signal when the input power of the LO signal, $P_{LO}$, is swept is indicated by the symbol □, and the signal leakage from the LO terminal to the IF terminal is indicated by the symbol o, and the signal leakage from the IF terminal to the LO terminal is indicated by the symbol ▽, these values being plotted on a graph. In the graph, the LO signal frequency, $f_{LO}$ is 800 (MHz), and the RF signal frequency, $f_{RF}$, is 950 MHz.

However, there have been the following problems with conventional mixer circuits.

The conventional mixer circuit 89 shown in FIG. 5 is composed such that the IF signal and LO signal are input via the same input terminal 149 of the mixer IC 188. Therefore, in order to isolate the IF signal and LO signal, it has been necessary to insert a first band-eliminating filter 186 and a second band-eliminating filter 187 comprising inductors and capacitors in the respective signal paths. Accordingly, there has been a problem in that this increases the installation surface area of the chip components forming the mixer circuit 18.

Moreover, in the mixer circuit 190 illustrated in FIG. 6, a large number of additional components, such as a bypass capacitor (capacitor 170), inductor 176, and a variable-voltage capacitor (varactor) 175, etc. are required, andthis requires aneven larger installation surface area. A further problem arises in that since the collector of the npn-type transistor 165 is earthed, insufficient conversion gain is obtained from the mixer circuit 190.

SUMMARY OF THE INVENTION

Therefore, the present invention was devised with the foregoing in view, an object thereof being to provide a mixer circuit whereby band-eliminating filters become unnecessary and size reductions can be achieved, whilst obtaining prescribed mixing characteristics.

In order to achieve this object, the mixer circuit according to the present invention comprises a first transistor and a second transistor of opposite conduction types, which are mutually connected, wherein the emitter of the first transistor is connected to the collector of the second transistor. It also comprises: a third transistor whose collector is connected to the emitter of the first transistor; a power supply terminal connected to the collector of the first transistor; an RF terminal connected to the collector of the first transistor; an LO terminal connected to the base of the first transistor; an IF terminal connected to the base of the second transistor; and a ground terminal connected to the emitter of the third transistor.

By means of this composition, in the present embodiment, the LO terminal and IF terminal of the mixer circuit are provided separately from each other. Consequently, there is no leaking to the IF terminal of the LO signal input from the LO terminal, nor any leaking to the LO terminal of the IF signal input to the IF terminal. Therefore, it is unnecessary to provide ban-eliminating filters at the LO terminal and IF terminal.

Furthermore, the mixer circuit according to the present invention comprises a first transistor and second transistor of opposite conduction types, which are mutually connected, wherein the collector of the first transistor is connected to the collector of the second transistor. The mixer circuit also contains: a third transistor whose base is connected to the collector of the first transistor; a power supply terminal connected to the emitter of the first transistor; an IF terminal connected to the base of the first transistor; a ground terminal connected to the emitter of the second transistor; an LO terminal connected to the base of the second transistor; and an RF terminal connected to the collector of third transistor.

BRIEF DESCRIPTION OF THE DRAWINGS

FIG. 7 is a diagram showing simulation results for a conventional mixer circuit.

DESCRIPTION OF THE PREFERRED EMBODIMENTS

Preferred embodiments of the present invention are described below.

Figure 1:
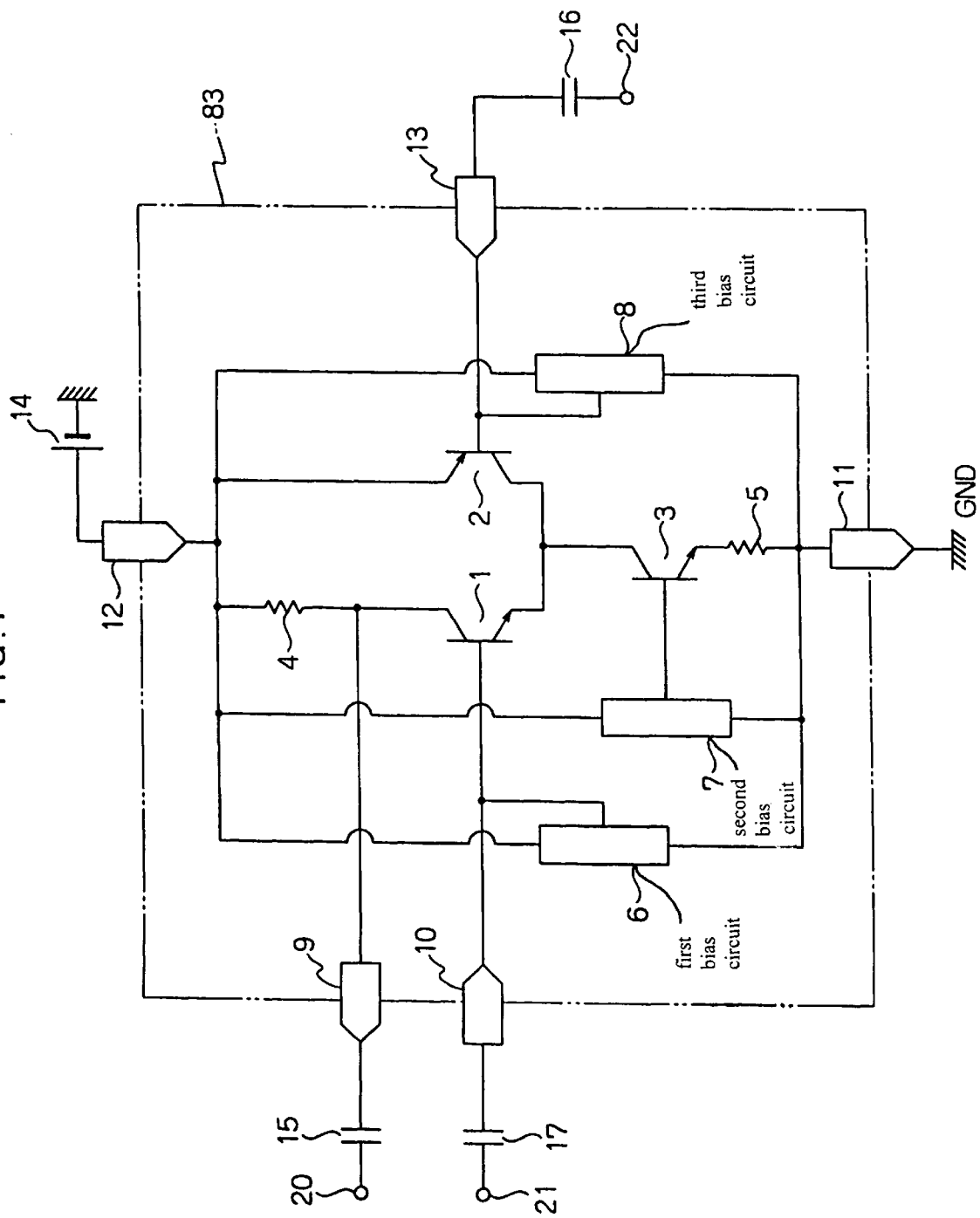
FIG. 1 is a diagram showing the composition of a mixer circuit relating to a first embodiment of the present invention.

As shown in FIG. 1, in a preferred embodiment of a mixer circuit 85 according t o the present invention, an intermediate frequency (IF) signal and a local (LO) signal are input respectively via separate terminals, and the aggregate signal of both signals is output from the RF terminal 9 as a high-frequency signal. A first transistor 1 is provided in the mixer circuit 83, and this first transistor is an npn-type, whose base is connected to an LO terminal 10.

A second transistor 2 is also provided in the mixer circuit 83. This second transistor 2 is a pnp-type, and its base is connected to an IF terminal 13. Furthermore, a third transistor 3 is also provided in the mixer circuit 83. This third transistor 3 is an npn-type, and its collector is connected to a common junction point between the emitter of the aforementioned first transistor 1 and the collector of the second transistor 2.

In addition to these transistors, the mixer circuit 83 also comprises: a first bias circuit 6 which supplies a bias voltage to the first transistor 1; a third bias circuit 8 which supplies abias voltage to the second transistor 2; and a second bias circuit 7 which supplies a bias voltage to the third transistor 3. As FIG. 1 demonstrates, each one of the first bias circuit 6, second bias circuit 7 and third bias circuit 8 are connected between a power supply terminal 12 and a ground terminal 11.

Furthermore, the collector of the first transistor 1 is connected to an RF terminal 9 and it is also connected to the power supply terminal 12 via a first resistor 4, whilst the emitter of the third transistor 3 is also connected to the ground terminal 11 via a second resistor 5.

As described previously, in the present embodiment, the LO terminal 10 and IF terminal of the mixer circuit 83 are provided separately from each other. Therefore, the LO signal input via the LO terminal 10 does not intrude into the IF terminal 13 side, whilst the IF signal input via the IF terminal does not intrude into the LO terminal 10 side. Consequently, it is unnecessary to provide band-eliminating filters for the LO terminal 10 or IF terminal 13.

The LO signal is input to the base of the first transistor 1 and the IF signal is input to the base of the second transistor 2. The LO signal and IF signal are then combined at the first transistor 1 and amplified nonlinearly, and a multiplied signal is output from the RF terminal 9.

In this mode of implementation, the mixer circuit 83 uses the third transistor 3, a constant-current supply formed by the second resistor 5, and the second transistor 2, and the collector resistance of the second transistor 2 is extremely high. Therefore, it is possible to do away with band-eliminating filters for preventing leakage of the LO signal to the IF side. Moreover, since the IF signal has a low input level, no practical problems arise even if it leaks to the LO side via the LO terminal. Therefore, in practical terms, no band-eliminating filter is required on the LO side.

Figure 3:
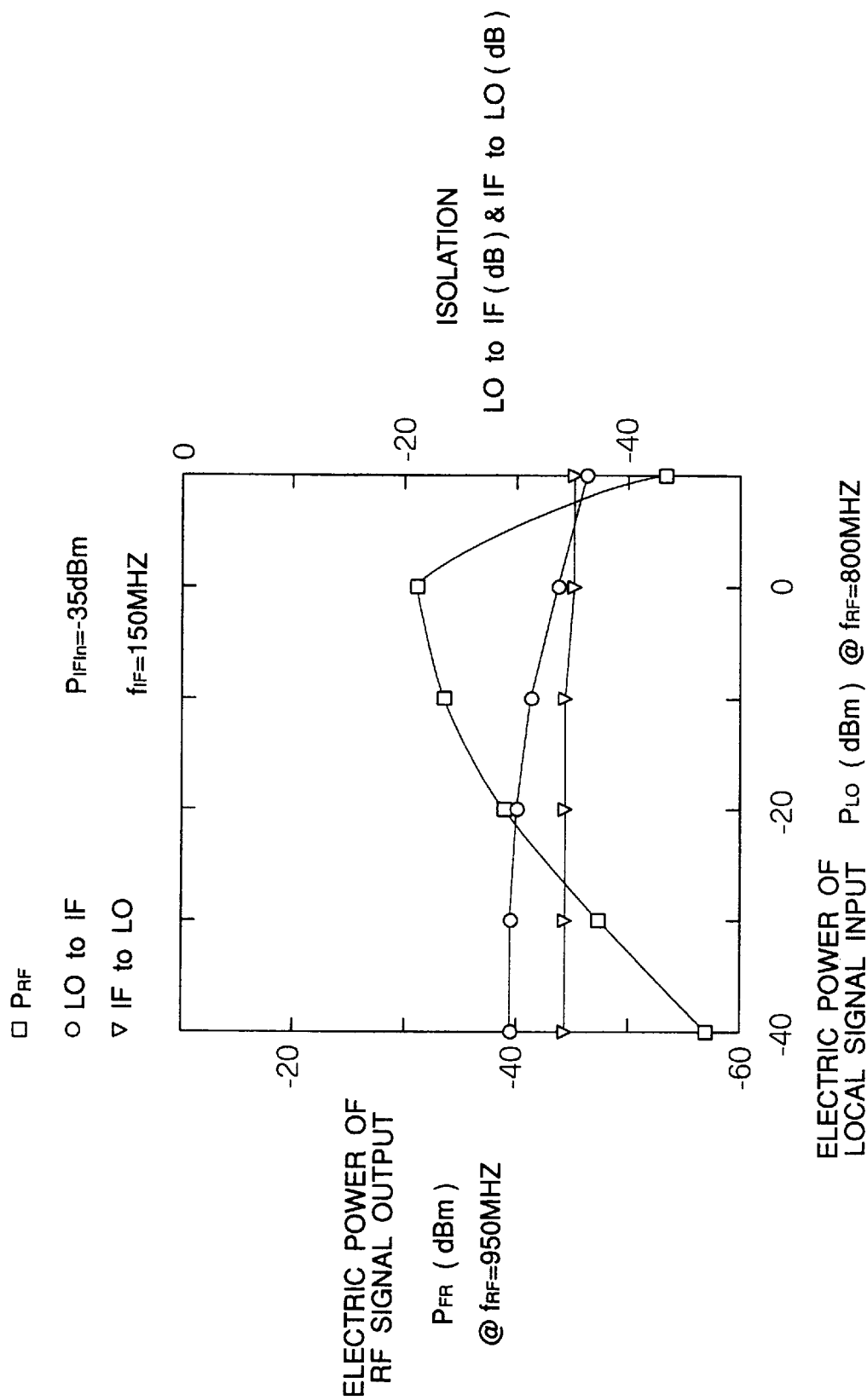
FIG. 3 is a diagram showing simulation results for a mixer circuit according to a first embodiment of the present invention.

FIG. 3 shows respective simulation results for a mixer circuit 83 relating to a first embodiment of the present invention. In FIG. 3, the input frequency, $f_{IF}$, of the IF signal is set to a constant 150 (MHz) at IF signal input power of $P_{IFin}=-35$ (dBm). The output power $P_{RF}$ of the RF signal when the input power of the LO signal, $P_{LO}$, is swept is indicated by the symbol □, the signal leakage from the LO terminal to the IF terminal is indicated by the symbol o, and the signal leakage from the IF terminal to the LO terminal is indicated by the symbol ▽, these values being plotted on a graph. In the graph, the LO signal frequency, $f_{LO}$ is 800 (MHz), and the RF signal frequency, $f_{RF}$, is 950 MHz. As FIG. 3 clearly demonstrates, compared to the conventional examples, there is no increase in power consumption, or the like. From the above, in the mixer circuit 83 according to the first embodiment of the present invention, it is possible to do away with two band-eliminating filters without making sacrifices in terms of power consumption or characteristics.

Figure 2:
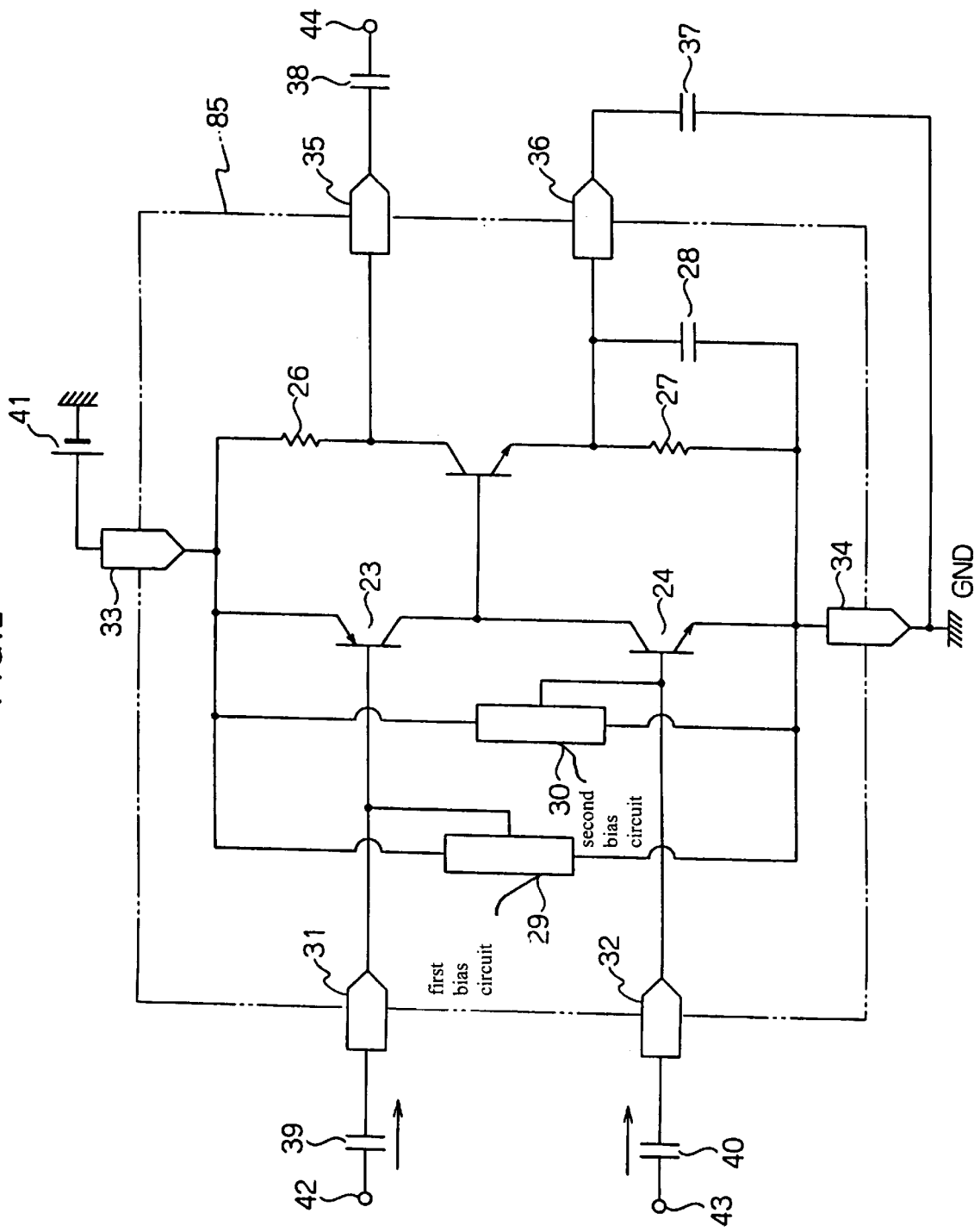
FIG. 2 is a diagram showing the composition of a mixer circuit relating to a second embodiment of the present invention.

Next, a second embodiment of the present invention is described. As FIG. 2 shows, the mixer circuit 85 comprises a first transistor 23 (pnp-type), a second transistor 24 (npn-type), and a third transistor 25 (npn-type). In the first transistor 23, the emitter is connected to a power supply terminal 33 and the base is connected to an IF terminal 31. In the second transistor 24, the base is connected to an LO terminal 32, and the emitter is connected to a ground terminal 34. In the third transistor 25, the collector is connected to an RF terminal 35 and also to a power supply terminal 33 via a first resistor, and the emitter is connected to an emitter terminal 36 and to a ground terminal 34 via a second resistor 27 and capacitor 28 connected in parallel.

The collector of the first transistor 23, the collector of the second transistor 24, and the base of the third transistor 25 are connected mutually. []Furthermore, a first bias circuit 29 and second bias circuit 30 are installed respectively with respect to the first transistor 23 and the second transistor 24, and this first bias circuit 29 and second bias circuit 30 are both connected between the power supply 33 and the GND terminal 34.

In this embodiment, by providing the IF terminal 31 and LO terminal 32 separately from each other in the mixer circuit 85, ban-eliminating filters become unnecessary, and the IF signal is input to the base of the first transistor 23, amplified by the first transistor 23, and then supplied to the base of the third transistor 25.

The LO signal is input to the base of the second transistor 24, and it is amplified by the second transistor 24 and then supplied to the base of the third transistor 25. Since the collectors of the first transistor 23 and the second transistor 24 are mutually connected, for the IF signal, the LO side appears to be in an open state, because the collector resistance of the second transistor 24 is very high, whilst for the LO signal, the IF side appears to be in an open state, because the collector resistance of the first transistor 23 is very high.

Therefore, the IF signal and LO signal are added together at the base of the third transistor 25, without leaking into the path of the other signal, and they are amplified nonlinearly by the third transistor 25 and output from the RF terminal 35. Thereby, in the present embodiment, it is possible to do away with two band-eliminating filters.

Figure 4:
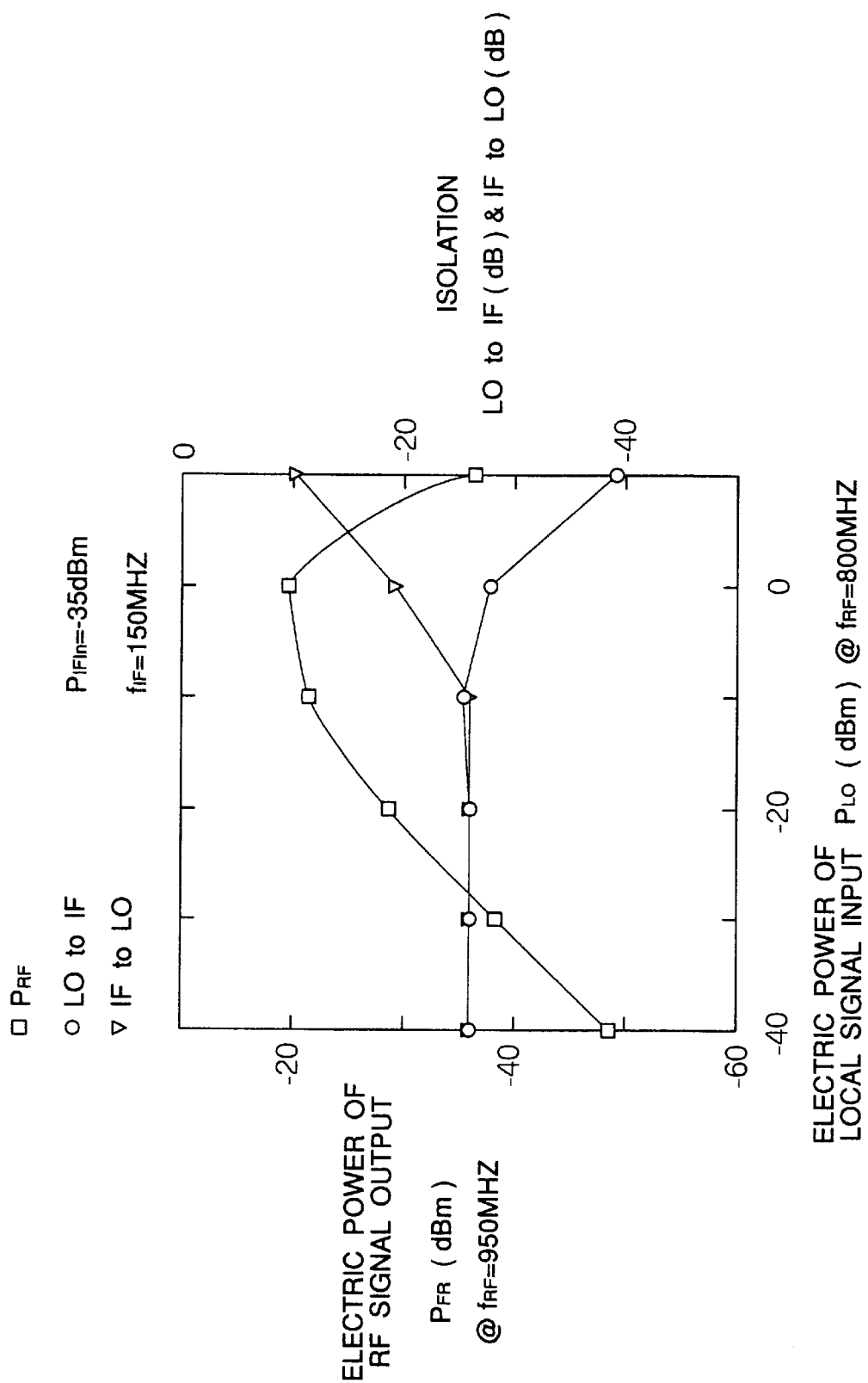
FIG. 4 is a diagram showing simulation results for a mixer circuit according to a second embodiment of the present invention.
Figure 5:
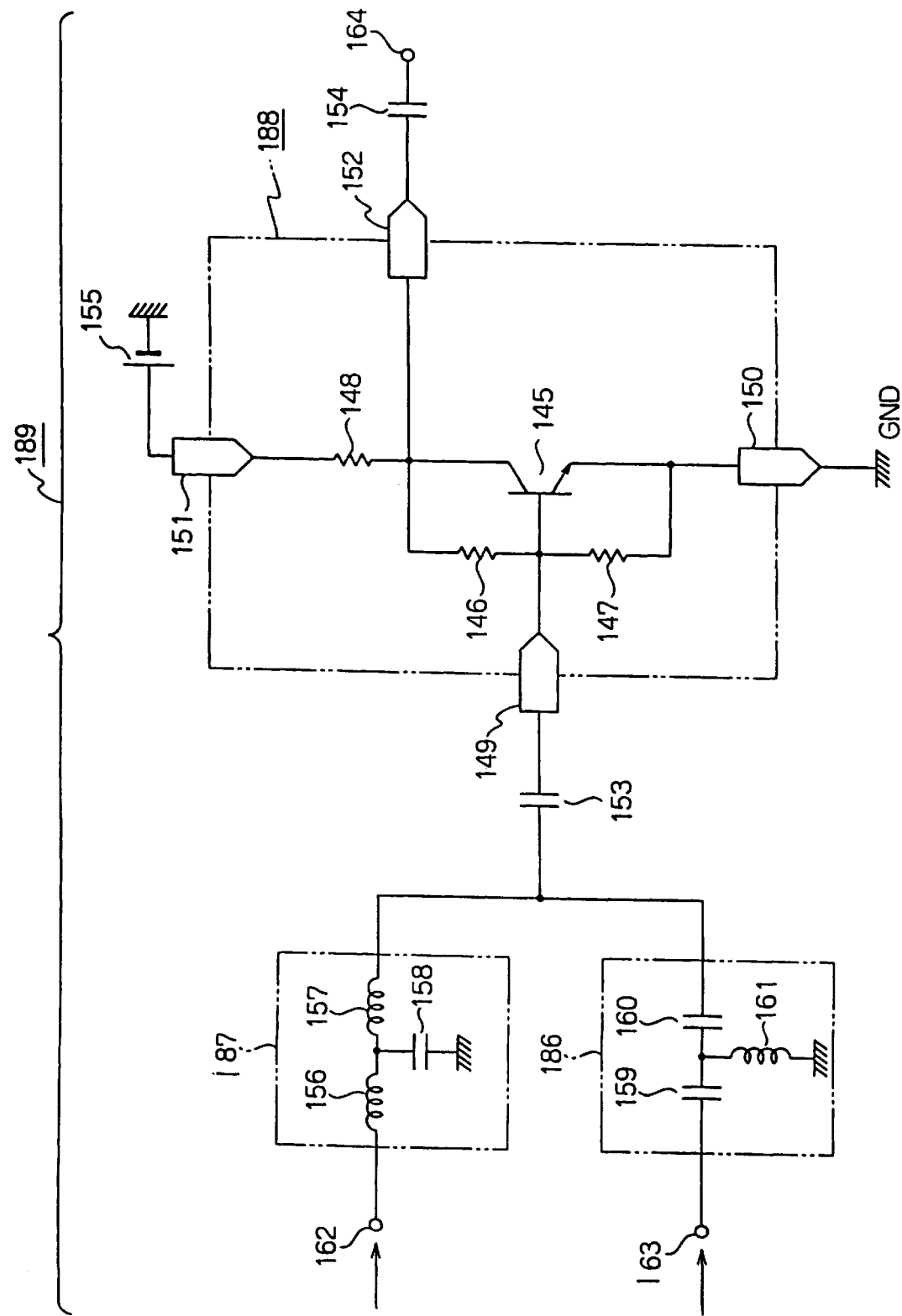
FIG. 5 is a diagram showing one example of a conventional mixer circuit.
Figure 6:
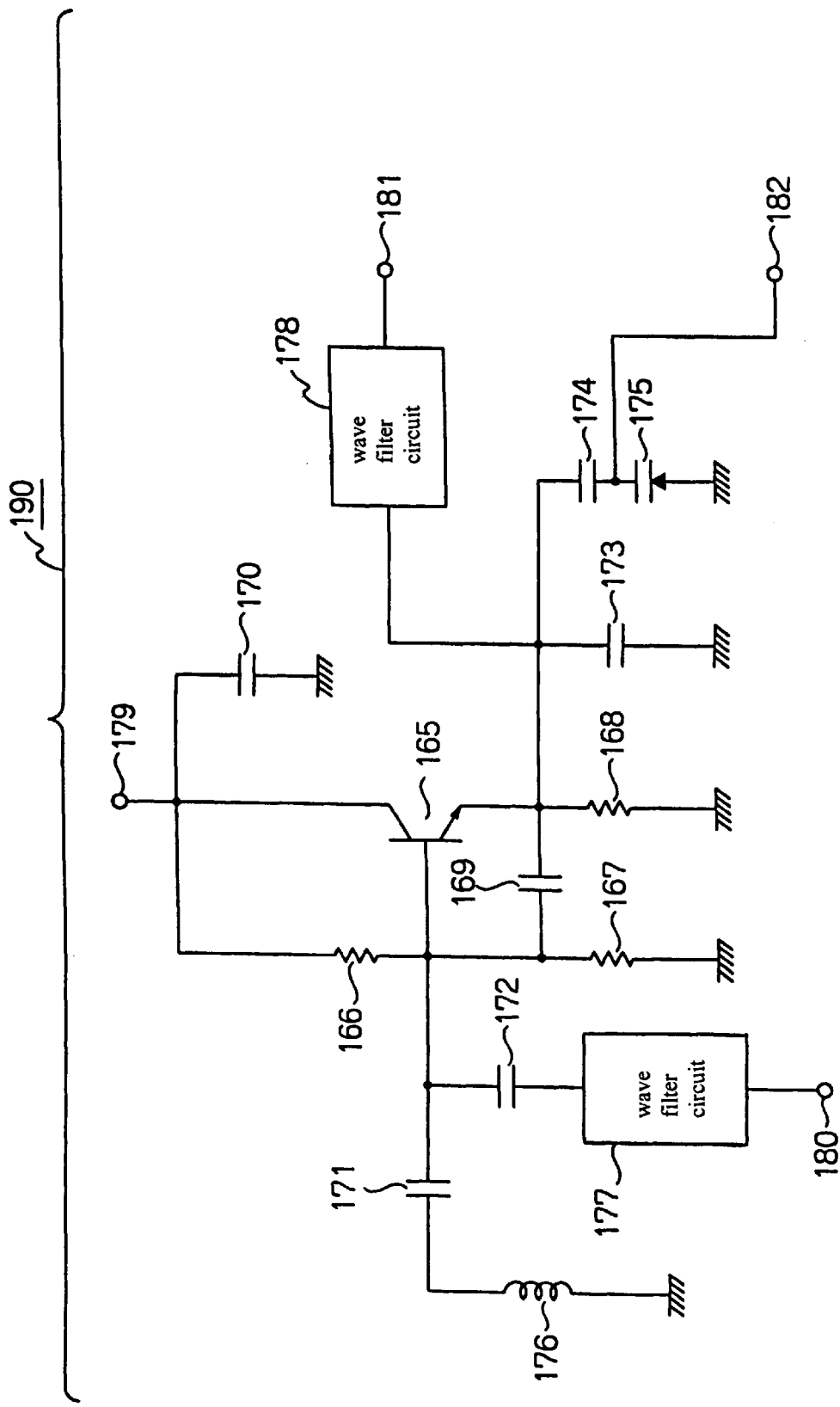
FIG. 6 is a diagram showing a further example of a conventional mixer circuit.

FIG. 4 shows simulation results for the mixer circuit 85 relating to the second embodiment. In FIG. 4, the input frequency, $f_{IF}$, of the IF signal is set to a constant 150 (MHz) at IF signal input power of $P_{IFin}$=−35 (dBm). The output power PRF of the RF signal when the input power of the LO signal, $P_{LO}$, is swept is indicated by the symbol □, the signal leakage from the LO terminal to the IF terminal is indicated by the symbol o, and the signal leakage from the IF terminal to the LO terminal is indicated by the symbol ▽, these values being plotted on a graph. In the graph, the LO signal frequency, $F_{LO}$ is 800 (MHz), and the RF signal frequency, $f_{RF}$, is 950 MHz. As the diagram clearly demonstrates, compared to the conventional examples, there is no increase in power consumption, or the like.

As FIG. 4 illustrates, in the mixer circuit 85 relating to the second embodiment, the power consumption is practically the same as conventional technology, but since two band-eliminating filters can be removed, and the IF signal and LO signal are added together and amplified nonlinearly, it is possible raise to conversion gain in comparison to the mixer circuit 83 according to the first embodiment.

As described above, according to the present invention, by providing the IF terminal and LO terminal of a mixer circuit separately from each other, a merit is obtained in that two band-eliminating filters can be removed whilst achieving virtually the same power consumption and the same characteristics as in a conventional mixer circuit.

The invention may be embodied in other specific forms without departing from the spirit or essential characteristic thereof. The present embodiments is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 8-227794 (filed on Aug. 9th, 1996) including specification, claims, drawings and summary are incorporated herein by reference in its entirety.

What is claimed is:

1. A mixer circuit comprising:
   a first transistor and a second transistor of different conduction types which are connected, wherein the emitter of the first transistor is connected to the collector of the second transistor, and the collector of the first transistor is connected to the emitter of the second transistor;
   a third transistor, whose collector is connected to the emitter of the first transistor;
   a power supply terminal connected to the collector of the first transistor;
   a radio frequency (RF) terminal connected to the collector of the first transistor;
   a local (LO) terminal connected to the base of the first transistor;
   an intermediate frequency (IF) terminal connected to the base of the second transistor; and
   a ground terminal connected to the emitter of the third transistor.

2. A mixer circuit comprising:
   a first transistor of npn-type and a second transistor of pnp-type which are connected, wherein the emitter of the first transistor is connected to the collector of the second transistor;
   a third transistor of npn-type, whose collector is connected to the emitter of the first transistor;
   a power supply terminal connected to the collector of the first transistor;
   a radio frequency (RF) terminal connected to the collector of the first transistor;
   a local (LO) terminal connected to the base of the first transistor;
   an intermediate frequency (IF) terminal connected to the base of the second transistor; and
   a ground terminal connected to the emitter of the third transistor.

3. The mixer circuit according to claim 2, further comprising:
   a first bias circuit for applying a bias voltage to the first transistor;
   a second bias circuit for applying a bias voltage to the second transistor;
   a third bias circuit for applying a bias voltage to the third transistor;
   a first resistor installed between the collector of the first transistor and the power supply terminal; and a second resistor installed between the emitter of the third transistor and the ground terminal.

4. A mixer circuit comprising:

a first transistor of pnp-type and a second transistor of npn-type which are connected, wherein the collector of the first transistor is connected to the collector of the second transistor;

a third transistor, whose base is connected to the collector of the first transistor;

a power supply terminal connected to the emitter of the first transistor;

an intermediate frequency (IF) terminal, connected to the base of the first transistor, for receiving an IF signal;

a ground terminal connected to the emitter of the second transistor;

a local (LO) terminal, connected to the base of the second transistor, for receiving an LO signal;

a radio frequency (RF) terminal, connected to the collector of the third transistor, for receiving said IF signal and said LO signal;

a first resistor installed between the collector of the third transistor and power supply terminal;

an emitter terminal connected to an emitter of the third transistor;

a second resistor and a capacitor installed between the emitter of the third transistor and the ground terminal, wherein the second resistor and the capacitor are connected in parallel;

a first bias circuit for applying a bias voltage to the first transistor; and a second bias circuit for applying a bias voltage to the second transistor.

5. A mixer circuit comprising:

a first transistor and a second transistor of different conduction types which are connected, wherein the collector of the first transistor is connected to the collector of the second transistor;

a third transistor, whose base is connected to the collector of the first transistor;

a power supply terminal connected to the emitter of the first transistor;

an intermediate frequency (IF) terminal connected to the base of the first transistor;

a ground terminal connected to the emitter of the second transistor;

a local (LO) terminal connected to the base of the second transistor;

a radio frequency (RF) terminal connected to the collector of the third transistor;

a first resistor installed between the collector of the third transistor and power supply terminal;

an emitter terminal connected to an emitter of the third transistor;

a second resistor and a capacitor installed between the emitter of the third transistor and the ground terminal, wherein the second resistor and the capacitor are connected in parallel;

a first bias circuit for applying a bias voltage to the first transistor; and a second bias circuit for applying a bias voltage to the second transistor.

6. The mixer circuit, as claimed in claim 5, wherein said first transistor comprises a pnp-type transistor and said second transistor an npn-type transistor.

* * * * *